US006825571B2

(12) United States Patent
Taniguchi

(10) Patent No.: US 6,825,571 B2
(45) Date of Patent: Nov. 30, 2004

(54) SEMICONDUCTOR DEVICE AND ITS MANUFACTURING METHOD, A CIRCUIT BOARD AND AN ELECTRONIC DEVICE

(75) Inventor: Jun Taniguchi, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/368,092

(22) Filed: Feb. 18, 2003

(65) Prior Publication Data

US 2003/0218260 A1 Nov. 27, 2003

(30) Foreign Application Priority Data

Feb. 21, 2002 (JP) ........................................ 2002-044929

(51) Int. Cl.[7] .......................... H01L 23/48; H01L 23/52; H01L 29/40
(52) U.S. Cl. ........................ 257/783; 257/782; 438/118
(58) Field of Search ................................ 257/783, 698, 257/782, 704; 438/118, 119, 125

(56) References Cited

U.S. PATENT DOCUMENTS

| 4,483,067 | A | * | 11/1984 | Parmentier | 29/840 |
| 5,612,576 | A | * | 3/1997 | Wilson et al. | 257/788 |
| 5,683,942 | A | * | 11/1997 | Kata et al. | 438/118 |
| 6,291,895 | B1 | * | 9/2001 | Taniguchi et al. | 257/782 |

* cited by examiner

Primary Examiner—S. V. Clark
(74) Attorney, Agent, or Firm—Rosalio Haro

(57) ABSTRACT

A raised portion 12 is formed on a substrate 10. The raised portion consists of a raised support pattern that preferably includes a wiring pattern. A sheet 30 is supported by the top surfaces of the raised support pattern such that the sheet is maintained apart from the base surface of the substrate 10. A semiconductor die 40 is adhered onto the sheet 30 using an adhesive agent 42. A sealant is used to create a sealed portion 50 that seals the semiconductor die 40 on the sheet 30. The sheet 30 has gas permeable region at least at a location accessible by the adhesive agent.

19 Claims, 5 Drawing Sheets

SEMICONDUCTOR DEVICE AND ITS MANUFACTURING METHOD, A CIRCUIT BOARD AND AN ELECTRONIC DEVICE

BACKGROUND OF THE INVENTION

1. Field of the Invention

This invention is related to a semiconductor device and its manufacturing method, a circuit board and an electronic device.

2. Description of the Related Art

Various types of package technologies are known for semiconductor integrated circuits, i.e. ICs. A popular type of these IC package technologies is plastic-sealed packaging. In a typical plastic-sealed package, or "plastic package", a semiconductor die composing an integrated circuit is typically attached to an interposer substrate by means of a die attach adhesive agent. In addition to providing support for the IC die, the interposer substrate typically provides a lead frame with a conductive path to externally accessible pins, bumps or other type of internal-to-external electrical interface. After the circuit on the IC die is electrically connected to the lead frame, a plastic sealant is used to encase the IC die, die attach adhesive, lead frame, and substrate interposer to form a plastic package.

In circuit board assembly processes, it is typically to first place multiple ICs on a printed circuit board, PCB, without soldering. Once the ICs are in place, the PCB undergoes a process known as solder reflow, or "reflow", in which the PCB is passed over a solder bath and the multiple ICs are thereby soldered in place. A difficulty associated with the use plastic package IC devices in reflow or other high temperature processes, however, is that the adhesive agents used to attach an IC die to an interposer substrate typically have moisture and air bubbles that may expand to become vapors under these high temperature processes. The expanding vapors may introduce cracks into the plastic package, introduce moisture into the IC die, or otherwise damage or weaken the IC device.

OBJECT OF THE INVENTION

An object of the invention is to overcome such conventional problems.

Another object of the present invention is to provide an IC package, and method for IC packaging, in which a vapor or other gas may be removed from a sealed package without damaging the package.

SUMMARY OF THE INVENTION (1) A. semiconductor device in accord with the present invention includes a substrate having a raised portion on one surface where at least a wiring pattern is partially formed, a sheet supported on the raised portion such that the sheet is maintained apart from the surface of said substrate, a semiconductor die is attached with an adhesive agent onto the sheet, and a sealed portion that seals the semiconductor die on the sheet, wherein the sheet has gas permeable region at least in a region where said adhesive agent isplaced.

According to the present invention, a space is formed between the sheet and the substrate so that gas generated in the adhesive agent can be released through a the gas permeable region of the sheet.

(2) In this semiconductor device, the sheet may have a penetrating, i.e. perforating, hole at least in the region where said adhesive agent is placed.

(3) In this semiconductor device, the raised portion may have a wiring pattern and a resist layer may cover over the wiring pattern.

(4) In this semiconductor device, the raised portion may be formed in a region including an end portion of the substrate.

(5) In this semiconductor device, the semiconductor die may be electrically connected to the wiring pattern by means of wire bonding.

(6) In this semiconductor device, the sheet may be have opening over the regions designated for wire bonding onto the wiring pattern.

(7). In a circuit board in accord with the present invention, a semiconductor device as described above may be installed.

(8) In an electronic device in accord with the present invention, a semiconductor device as described above may be installed.

(9) A method of manufacturing a semiconductor device in accord with the present invention includes the steps of: sealing a semiconductor die with plastic, using an adhesive agent to adhere the semiconductor die to a sheet, supporting the sheet with an upper end of a raised portion formed on a substrate so as to maintain the sheet apart from the surface of the substrate, assuring the sheet has a be gas permeable region in a region where said adhesive agent is placed, making the raised portion have a wiring pattern and sealing the semiconductor die onto the sheet.

According to the present invention, a space is formed between the sheet and the substrate so that gas generated in the adhesive agent can be released through the permeable region.

(10) A method of manufacturing the present semiconductor device may further include a step of connecting the semiconductor die to the wiring pattern using wire bonding before sealing the semiconductor onto the sheet.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 7:
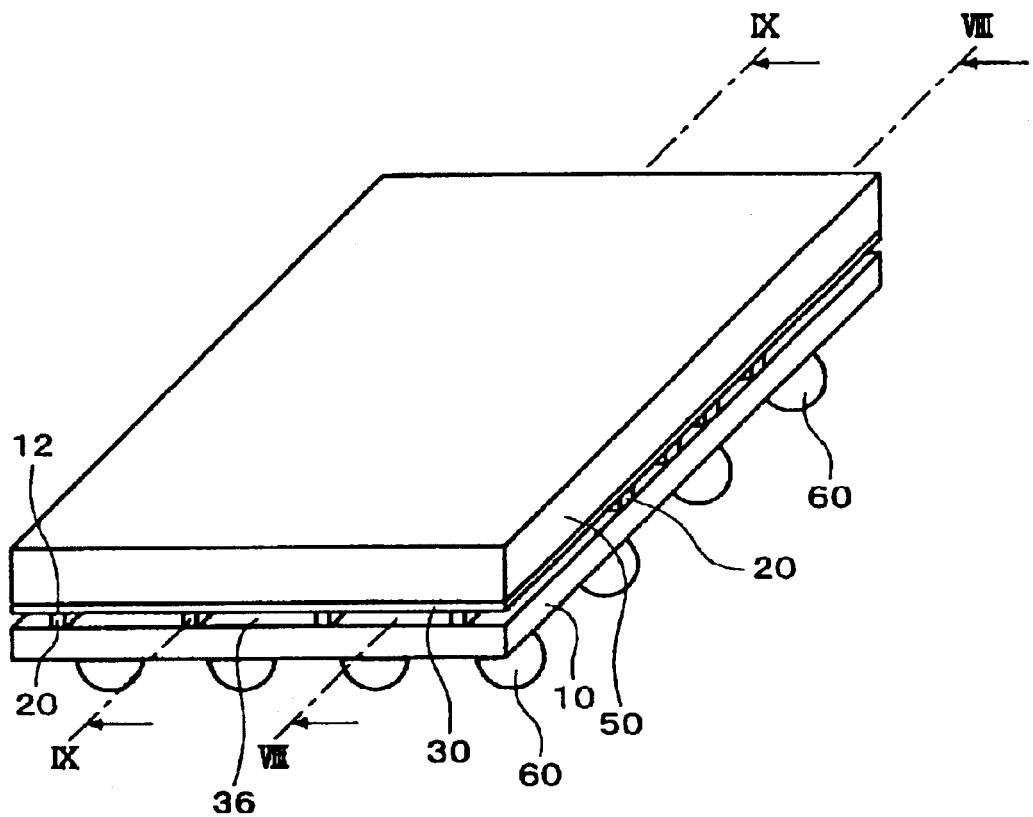
FIG. 7 shows perspective view of an IC device in accord with the processes of FIGS. 1–6, and further including external terminals.
Figure 8:
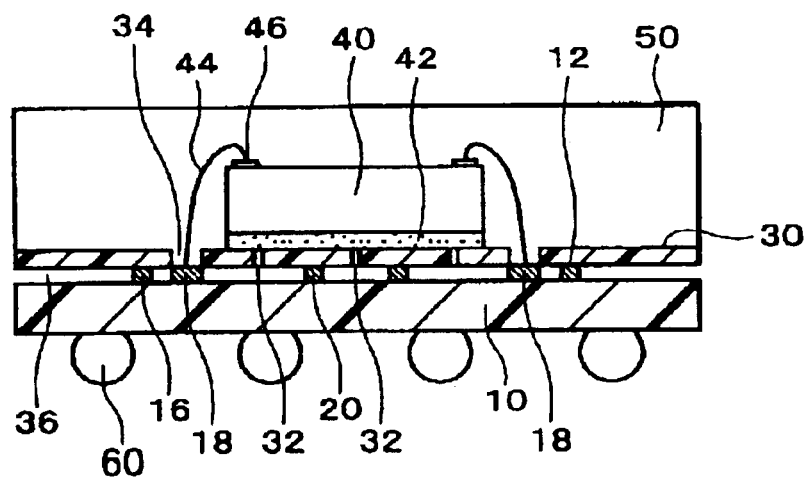
FIG. 8 shows a cross sectional view of the IC device of FIG. 7 along line VIII—VIII.
Figure 9:
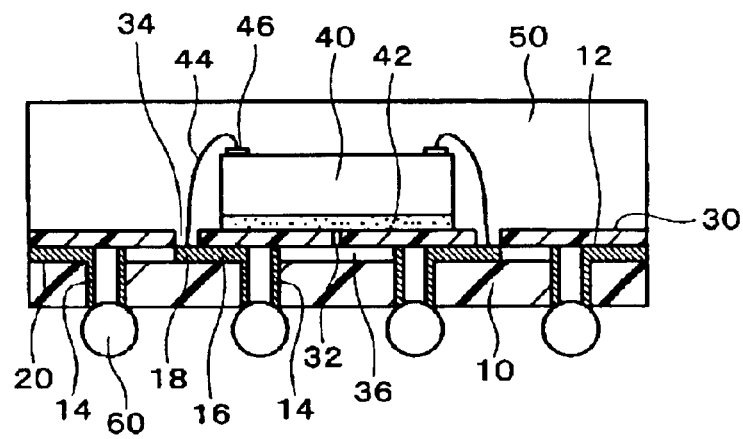
FIG. 9 shows a cross sectional view of the IC device of FIG. 7 along line IX—IX.

Preferred embodiments are explained hereafter with reference to the figures where like elements are identified by like reference characters. FIG. 1 to FIG. 6 explain manufacturing process for encasing a semiconductor die on an interposer substrate in accord with the present invention. FIG. 7 to FIG. 9 show a semiconductor device with external terminals in accord with the present invention.

In this embodiment, a substrate support 1 is divided into multiple cut-out regions defining the outline of multiple interposer substrates 10. In other words, the substrate support 1 will be cut to form a plurality of individual interposer substrates 10 in a post process shown in FIG. 6. Substrate support 1 may be a tape substrate, a sheet substrate, or any other known arrangement for defining multiple interposer substrates 10. On at least one surface of substrate support 1, a raised portion 12 is formed within the area of each interposer substrate 10. Raised portion 12 preferably consists of elevated support members that may be constructed of the same material as interposer substrate 10. Alternatively, part (or all) of the elevated support members constituting raised portion 12 may include wiring patterns, such as a lead frame.

Within each interposer substrate 10, there is at least one through-hole 14 (or a plurality of through-holes 14). The through-hole 14 is formed for electrical connection between the upper and lower surface of interposer substrate 10. Within each interposer substrate 10, a first wiring pattern 16 extends through through-hole 14. The first wiring pattern 16 can be extended to a central area of a corresponding interposer substrate 10. The first wiring pattern 16 includes a bonding section 18 for wire bonding with a semiconductor die. A second wiring pattern 20 also extends from the through-hole 14. The second wiring pattern 20 preferably extends beyond the area defined by its corresponding interposer substrate 10. A third wiring pattern 22 is formed on the substrate 10. The second wiring pattern 20 is connected to the third wiring pattern 22 via a connecting portion. Stated more succinctly, the first wiring pattern 16 extends from through-holes 14 to bonding section 18 for wire bonding with a semiconductor die, and the second wire pattern 20 extends from through-holes 14 to third wire pattern 22, which preferably runs around the perimeter of an area defined the corresponding interposer substrate 10. Hence, in the present embodiment, all wiring patterns 16, 18, 20, and 22 are initially connected to each other and are therefore easy to electroplate. As it would be understood, wiring patterns 16, 18, 20, and 22 may be part of a lead frame for a corresponding interposer substrate 10.

In the presently preferred embodiment, at least the first wiring pattern 16 and second wiring pattern 20 may form part of the raised portion 12. As is explained more fully below, each of wiring patterns 16 and 20 have a predefined thickness, and their structure thereby forms the support members of raise portion 12 with their thickness defining the height of raised portion 12. As it will additionally be explained, if wiring patterns 16 or 20 are used to make up part of raised portion 12, then the layout pattern of at least two adjacent lead traces must form an air passage having a specific characteristic more fully explained below.

Figure 1:
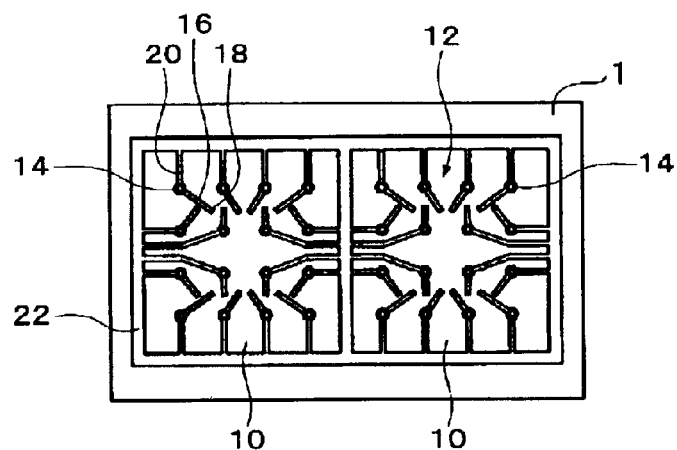
FIG. 1 is a top view of a substrate support having two lead frames on two adjacent interposer substrates, each in accord with the present invention.
Figure 2:
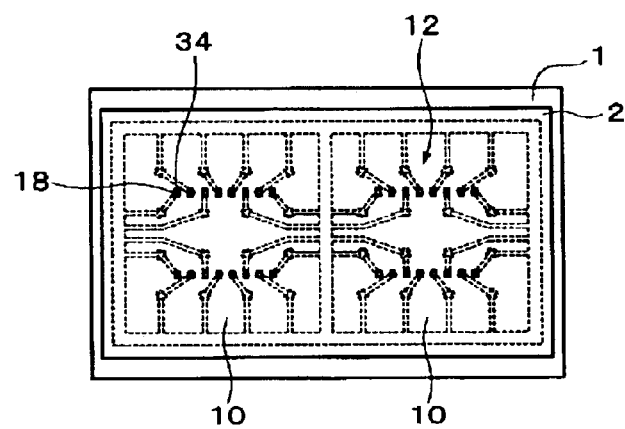
FIG. 2 shows a sheet covering the structure of FIG. 1 with the wiring pattern of FIG. 1 under the sheet shown in dotted lines.

As shown in FIG. 2, a sheet 2 is adhered to, and covers over, substrate support 1 including wiring patterns 16, 18, 20, and 22. The sheet 2 thus covers the area defined by an interposer substrate 10. The part of sheet 2 over a corresponding raised portion 12 is supported by the support members of the raised portion 12 such that the support members maintain a gap between sheet 2 and the surface of interposer substrate 10. The sheet 2 can be adhered by pressure adhesion with heat and pressure, or by an adhesive agent, no shown. The sheet 2 may be made of a material (such as polyimide plastic) that is thermal proof (i.e., that is resistant to the temperatures of reflow processes). Sheet 2 is cut along with support substrate 1 to form individual interposer cover sheets 30 in the post process step of FIG. 6.

Figure 3:
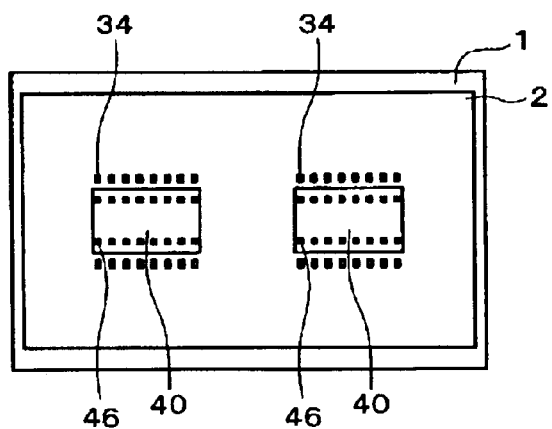
FIG. 3 is a top view of a die on the sheet of FIG. 2, indicating preferred locations of contact pads on the die and of through-holes in the sheet.

Referring to FIG. 3, an IC die 40 is attached onto sheet 2 using an adhesive 42, shown in FIGS. 8 and 9. As shown in FIG. 3, IC die 40 is attached face-up, i.e. with its contact pads facing upwards. Through-holes 34 in sheet 2 are aligned with corresponding contact points of bonding section 18 of the wiring pattern under sheet 2. In other words, sheet 2 covers wiring patterns 16, 18, 20, and 22, but through-holes 34 expose bonding section 18 so that the contact pads 46 of IC die 40 may be electrically connected to corresponding contact point on bonding section 18.

Preferably, sheet 2 additionally has an opening in the region of adhesive agent 42. This opening will be part of a gas permeability path formed by the support members of raised portion 2 and extending from under the area where adhesive agent 42 is formed. For example, as shown in FIGS. 8 and 9, a penetrating hole 32, i.e. the aforementioned opening, is formed in sheet 2 in each area of interposer cover sheet 30 under die 40. As shown, adhesive 42 is used for attaching die 40 to interposer cover sheet 30, but penetrating hole 32 provides a path from adhesive 42, through interposer cover sheet 30, to interposer substrate 10.

Furthermore, sheet 2 is arranged so as to avoid covering bonding section 18. For example, through-holes 34 in sheet 2 can be overlapped with bonding section 18 for wire bonding.

As explained above, each interposer cover sheet 30 is supported by the upper surface of the support members of raised portion 12 so that interposer cover sheet 30 is supported above, and maintained apart from, the surface of interposer substrate 10. This is more easily seen in FIG. 7 and FIG. 9 where, as explained above, the support members of raised portion 12 are preferably made up of the wiring patterns. In FIG. 7, raised portion 12 includes the wiring patterns (i.e. at least first and second wiring patterns 16 and 20), and therefore spans across the entire area of interposer substrate 10. As shown, the outer ends of second wiring pattern 20 support interposer cover sheet 30 over interposer substrate 10. It is to be understood that at least first wiring pattern 16, and preferably part of bonding section 18, provide support for interposer cover sheet 30 within the inner area of interposer substrate 10. In accord with the present invention, at least two adjacent wiring traces form an unblocked tunnel, or air path, extending from penetrating hole 32 (FIG. 8) to the outside of the package. Air path 36 is formed by the side surface-walls of the support members of raised portion 12, the underside surface of the interposer cover sheet 30, and the upper surface of interposer substrate 10.

As shown in FIG. 3, at least one semiconductor die 40 (or a plurality of semiconductor dies 40) is attached to the surface of the sheet 2. Specifically, semiconductor die 40 is attached to the area where each interposer cover sheet 30 will be formed by cutting the sheet 2 (see FIG. 6). Adhesive agent 42 (See FIGS. 8 and 9) is used to attach die 40 to sheet 2. If support members of the raised portion 12 are located under sheet 2 directly under adhesive agent 42, then semiconductor die 40 will be supported by the raised portion 12. The semiconductor die 40 preferably has a plurality of electrodes 46 (i.e., contact pads). The semiconductor die 40 is attached onto sheet 2 with the electrodes 46 facing upward.

Figure 4:
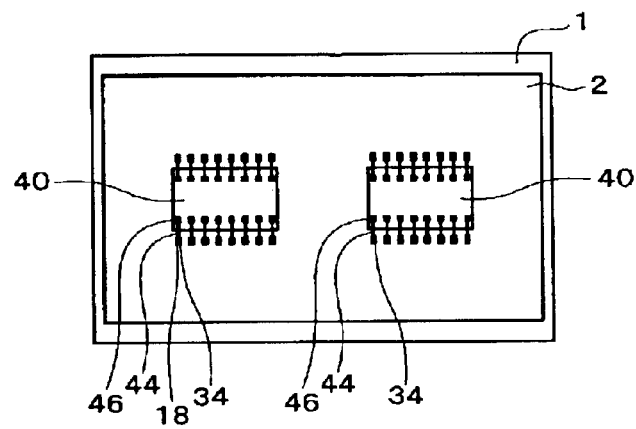
FIG. 4 shows the die of FIG. 3 wire boned via the through-holes in the sheet to wire traces under the sheet.

As shown in FIG. 4, the semiconductor chip 40 is electrically connected to the wiring pattern (for example, the first wiring 16, or more specifically the bonding section 18 of first wiring pattern 16) by wire bonding. In detail, the wire 44 is bonded to contact pad electrode 46 and to the wiring pattern (for example, bonding section 18). Here, the contact points of bonding section 18 are exposed via through-holes 34 in sheet 2.

Figure 5:
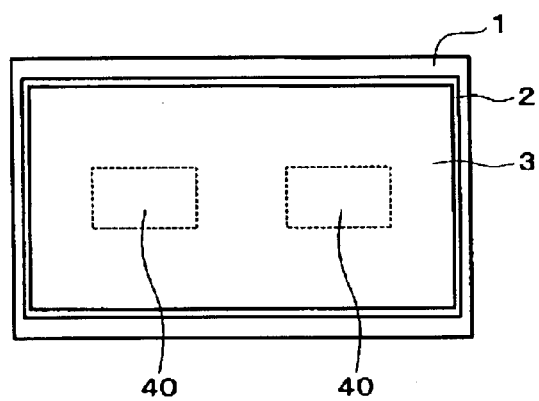
FIG. 5 shows the structure of FIG. 4 sealed with molding, with the location of the die indicated by dotted lines

As shown in FIG. 5, the semiconductor die 40 is sealed. For example, a semiconductor die is sealed with plastic material. A metal mode may be used to seal the semiconductor die by means of molding type sealing. If the sealant material is plastic, then the plastic is called molding plastic. This plastic forms a sealed portion 3. The sealed portion 3 seals the semiconductor die 40 on sheet 2 and also seals the adhesive agent 42. The sheet 2 does not permeable to the molding plastic, and thus blocks the molding plastic and does not let itpass through. Hence, the air path 36 formed between sheet 2 and interposer substrate 10 cannot be blocked by the molding plastic (see FIGS. 7 and 9).

Figure 6:
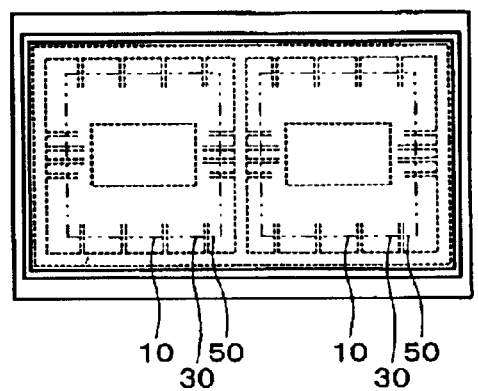
FIG. 6 shows cutting patterns for separating the structure of FIG. 5 into a plurality of individual IC devices.

As shown in FIG. 6, substrate support 1, sheet 2 and sealed portion 3 are cut to form individual IC packages, such as by cutting along the shown dot-dot-dash line. In this manner, substrate support 1 is cut into a plurality of the interposer substrates 10. At the same time, sheet 2 is cut into be a plurality of interposer cover sheets 30, and sealed portion 3 is cut into a plurality of sealed portions 50. Here, the wiring patterns (the first 16, second 20 and the third 22 wiring patterns) are separated as appropriate. In the present example, second wiring pattern 20 is cut from third wiring pattern 22. Second wiring 20 stays on interposer substrate 10. A single interposer cover sheet 30 is located on each interposer substrate 10, and a single sealed portion 50 is located on each interposer substrate 10.

With reference to FIG. 7, in an alternate embodiment of the present invention, at least one external terminal 60 is formed on the underside of interposer substrate 10. A process for forming external terminals 60 would preferably be implemented before the cutting process of FIG. 6. External terminals 60 may be made of conductive wax (soft wax or hard wax), conductive paste, soldering ball, or other conductive pliable material. As shown in FIG. 9, external terminals 60 are formed on through-holes 14 on the bottom side of interposer substrate 10, i.e. the side opposite raised portion 12.

The semiconductor device shown in FIG. 7 can be formed by the process explained above. FIGS. 8 and 9 show cross sectional views of the semiconductor device of FIG. 7 along lines VIII—VIII and a IX—IX, respectively.

As shown in FIGS. 8 and 9, raised portion 12 is at least partially composed of the wiring patterns, and is formed on one surface of the interposer substrate 10. Interposer cover sheet 30 is supported by the upper service of the support members of raised portion 12. Interposer cover sheet 30 is maintained separate from the base surface area interposer substrate 10 (i.e. excluding any part of interposer substrate 10 that may constitute part of the support members of raised portion 12). Thus, air path 36 is formed between interposer substrate 10 and the interposer cover sheet 30, and extending from adhesive 42 through interposer cover sheet 30 to the outside of the package. Semiconductor die 40 is adhered to interposer cover sheet 30 by means of with adhesive agent 42. Semiconductor die 40 is sealed by the sealed portion 50 on interposer cover sheet 30. Sealed portion 50 also seals the adhesive agent 42. Other details are the same as have already been explained above.

In this embodiment, interposer cover sheet 30 has gas permeable opening in an area accessible to the adhesive agent 42. For example, the interposer cover sheet 30 has penetrating hole 32 in the area where at least the adhesive agent 42 is formed. Thus, it is possible that the adhesive agent 42, although sealed by the sealed portion 50, maintains an access path to the outside atmosphere via the air path 36. Therefore, gas (for example, vapor generated from moisture and bubbles within the adhesive agent 42) can be removed through the air path 36 without damaging the packaged device.

Figure 10:
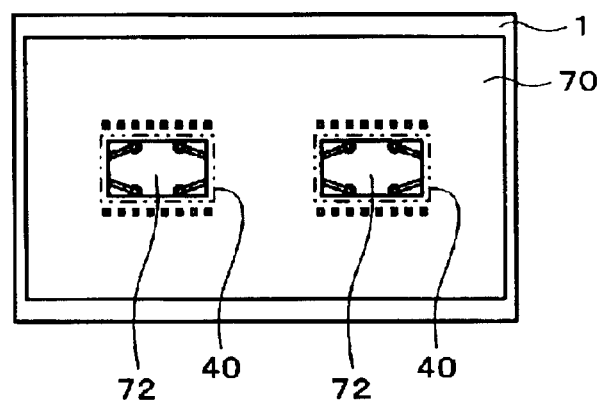
FIG. 10 shows an alternate embodiment of the present invention wherein a large opening is made in the sheet in an area under the die.

FIG. 10 shows another example of the present embodiment. In this example, interposer cover sheet 70 is similar to interposer cover sheet 2 of FIG. 2 except that penetrating hole 72 is formed within the region where semiconductor die 40 is to be attached and the size of penetrating hole 72 is preferably larger than penetrating hole 32 of FIG. 9. More specifically, penetrating hole 72 is still smaller, a little bit, than the footprint size of semiconductor die 40 although larger than the penetrating hole 32 shown in FIGS. 8 and 9. In this case, only the outer perimeter potion of the semiconductor die 40 is attached to the interposer cover sheet 70. The center portion of the semiconductor die 40 is located within penetrating hole 72. In this case, die 40 may optionally also be attached directly to interposer substrate 10. Other details of the structure of FIG. 10 are the same as those of FIGS. 1–9 explained above. This example attains a similar effect as the embodiment explained before. That is, it provides path for the vapors created in adhesive 42 to escape to the atmosphere.

Figure 11:
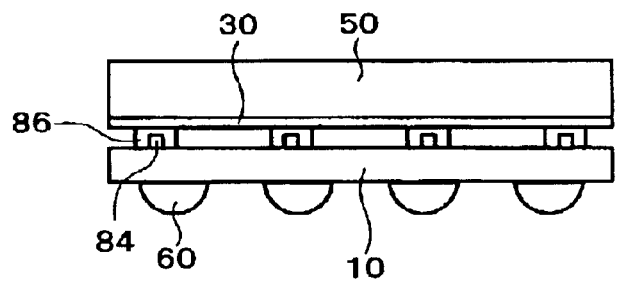
FIG. 11 shows a further enhancement to the present invention wherein the wire pattern is covered with a resist.

FIG. 11 shows a further example of an alternate embodiment of the present embodiment. In the example shown in FIG. 11, the raised portion 82 includes wiring pattern 84 and a resist layer 86 covering wiring pattern 84 as part of its support members. In this case, resist layer 86 may also cover the ends of wiring pattern 84 that face the outside so as to avoid exposing the end points to the atmosphere. Other details are the same explained above. This example attains the same effect of the embodiment explained before.

Figure 12:
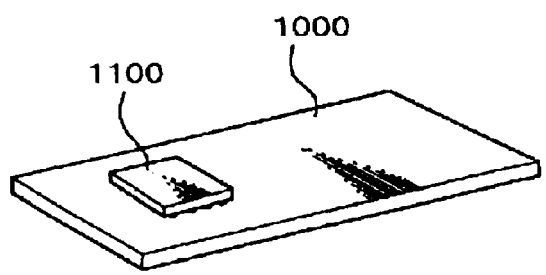
FIG. 12 shows a circuit board incorporating an IC device in accord with the present invention.
Figure 13:
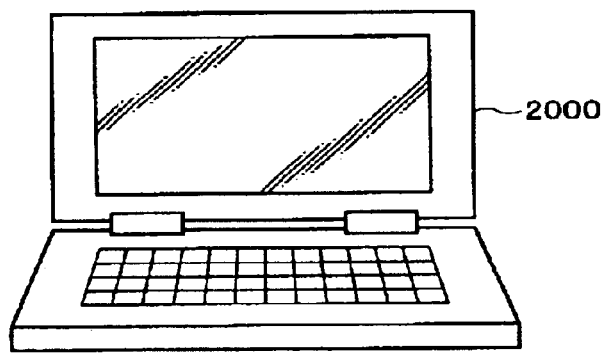
FIG. 13 shows an electronic device, i.e. a computer, incorporating an IC device in accord with the present invention.
Figure 14:
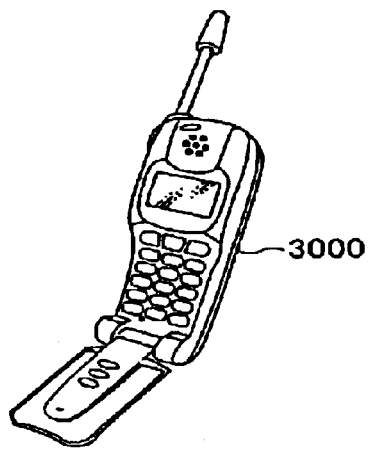
FIG. 14 shows an electronic device, i.e. a cellular telephone, incorporating an IC device in accord with the present invention.

FIG. 12 shows a circuit board 1000 where a semiconductor device 1100 in accord with the present invention is installed. FIG. 13 shows a note-type personal computer 2000 having a semiconductor device in accord with the present invention, such as the above-mentioned semiconductor device is installed. FIG. 14 shows a mobile type telephone 3000 where the above-mentioned semiconductor device is installed.

While the present invention has been particularly shown and described with reference to preferred embodiments thereof, it will be understood by those skill in the art that the foregoing along with other changes in form and details may be made therein without departing from the spirit and scope of the invention. Further, the present invention includes a structure where non-critical parts in the embodiments explained above are replaced with others. Further, the present invention includes a structure which can substantially attain the same function and the same effect of the embodiments explained above. Further, the present invention includes a structure where prior art features are added to the embodiments explained above.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device comprising;
   a support substrate having a raised support pattern on a surface thereof;
   a sheet supported on said raised support pattern so as to be at least partly separated from a base of said surface;
   a semiconductor die adhered with an adhesive agent to said sheet;
   a sealant to seal said semiconductor die on said sheet;
   wherein said sheet is permeable to gaseous matter at least at a region accessible to said adhesive agents;
   wherein said raised support pattern includes a wiring pattern covered by a resist layer.

2. A semiconductor device claimed in claim 1, wherein:
   said sheet has a perforating hole in said region.

3. A semiconductor device according to claim 1, wherein:
   said raised support pattern extends to the outer end perimeter of said surface of said support substrate.

4. A semiconductor device according to claim 1, wherein:
   said semiconductor die is electrically connected to said wiring pattern by wire bonding.

5. A semiconductor device claimed in claim 4, wherein;
   said sheet has through-holes exposing predetermined locations of said wiring pattern, and said semiconductor is wire bonded to said wiring pattern through said through-holes.

6. A circuit board wherein;
   a semiconductor device as claimed in claim 1 is installed.

7. An electronic device wherein;
   a semiconductor device as claimed in claim 1 is installed.

8. The semiconductor device of claim 1, wherein said raised support pattern forms a path extending from said gas permeable region to an outside edge of said substrate.

9. The semiconductor device of claim 8, wherein said path is a walled path, and said walled path along with said surface of said substrate and the side of said sheet facing said surface form a tunnel for exposing said gas permeable region to the atmosphere outside said semiconductor device.

10. A method of manufacturing a semiconductor device, comprising the steps of:
    defining a raised portion on a base surface of a substrate, wherein said raised portion is made of support members extending from said base surface and said support member includes a wiring pattern;
    covering at least part of said wiring pattern with a protective coating;
    securing a sheet onto said raised portion such that at least part of said sheet is maintained separated from said base surface;
    assuring that said sheet includes a gas permeable region;
    using an adhesive agent to attach a semiconductor die in the vicinity of said gas permeable region such that said adhesive agent has access to said gas permeable region, wherein at least a portion of said semiconductor die overlays said sheet;
    using a mold sealant to seal said semiconductor die upon said sheet.

11. The method of claim 10, wherein said gas permeable region is an opening having an area smaller than the base area of said semiconductor die.

12. The method of claim 11, wherein said adhesive agent passes through said opening to attach to said base surface of said substrate.

13. The method of claim 11, wherein said opening is a perforating hole of size sufficiently small to substantially prevent said adhesive agent from extending from one side of said sheet, through said perforating hole, to said base surface of said substrate.

14. The method of claim 10, wherein said support members form a path extending from said gas permeable region to an outside edge of said substrate.

15. The method of claim 14, wherein said path is a walled path, and said walled path along with said base surface of said substrate and the side of said sheet facing said base surface form a tunnel for exposing said gas permeable region to the atmosphere outside said semiconductor device.

16. The method of claim 10, wherein said mold sealant is plastic.

17. The method of claim 10, wherein said adhesive agent is further used to adhere said semiconductor die to said sheet.

18. A method of manufacturing a semiconductor device according to claim 1, further comprising a step of:
    connecting said semiconductor die to said wiring pattern by wire bonding before using said mode sealant to seal said semiconductor die upon said sheet.

19. The method of claim 1 wherein said semiconductor die includes contact pads, and said sheet includes through-holes exposing contact points on said wiring pattern, said method further including:
    wire bonding said contact pads to said contact points through said through-holes prior to the step of using a mold sealant to seal said semiconductor die upon said sheet.

* * * * *